United States Patent [19]
Yuge et al.

[11] Patent Number: 6,030,848
[45] Date of Patent: *Feb. 29, 2000

[54] METHOD FOR MANUFACTURING A GAN-BASED COMPOUND SEMICONDUCTOR LIGHT EMITTING DEVICE

[75] Inventors: Shozo Yuge; Hideto Sugawara, both of Kanagawa-ken, Japan

[73] Assignee: Kabushiki Kaisha Toshiba, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/843,657

[22] Filed: Apr. 16, 1997

[30] Foreign Application Priority Data

Jun. 28, 1996 [JP] Japan ..................................... 8-188835

[51] Int. Cl.⁷ ..................................................... H01L 21/00
[52] U.S. Cl. ........................... 438/46; 438/503; 438/507; 438/509; 438/796; 148/DIG. 3
[58] Field of Search ............................. 438/46, 503, 507, 438/509, 796; 148/DIG. 3

[56] References Cited

U.S. PATENT DOCUMENTS

| | | | |
|---|---|---|---|
| 5,182,670 | 1/1993 | Khan | 359/359 |
| 5,557,167 | 9/1996 | Kim et al. | 313/542 |
| 5,585,648 | 12/1996 | Tischler | 257/77 |
| 5,661,074 | 8/1997 | Tischler | 438/32 |
| 5,665,986 | 9/1997 | Miura et al. | 257/96 |
| 5,697,826 | 12/1997 | Kim et al. | 445/58 |
| 5,756,374 | 5/1998 | Miura et al. | 438/46 |

FOREIGN PATENT DOCUMENTS

| | | |
|---|---|---|
| 6-216409 | 8/1994 | Japan . |
| 6-232451 | 8/1994 | Japan . |
| 8-325094 | 12/1996 | Japan . |
| 9-36429 | 2/1997 | Japan . |

*Primary Examiner*—Peter Toby Brown
*Assistant Examiner*—Long Pham
*Attorney, Agent, or Firm*—Finnegan, Henderson, Farabow, Garrett & Dunner, L.L.P.

[57] ABSTRACT

A manufacturing method for high quality GaN-based light emitting devices. The method enable effective growth of an $Al_yGa_{1-y}N$ ($0 \leq y \leq 1$) layer on an $In_xGa_{1-x}N$ ($0 \leq x \leq 1$) layer by CVD. While holding or increasing the temperature after growing the InGaN layer at the temperature of T0 before growing the AlGaN at the temperature of T1 (T0 $\leq$ T1) in an atmosphere including a source of group V of elements, the present invention applies an inert gas as the carrier gas which includes a source of the group V elements. Therefore, the concentration of group V elements near the surface of the InGaN layer increases and the sublimation of the InGaN layer is prevented by increasing the steam pressure of the group V elements near the surface of the InGaN layer.

25 Claims, 7 Drawing Sheets

METHOD FOR MANUFACTURING A GAN-BASED COMPOUND SEMICONDUCTOR LIGHT EMITTING DEVICE

BACKGROUND OF THE INVENTION

1. Field of the Invention

The present invention relates to method for manufacturing a GaN-based compound semiconductor light emitting device. A blue light emitting diode (LED) or a blue laser diode (LD) has a heterostructure of an InGaN layer and an GaN-based layer.

2. Description of the Related Art

Blue LEDs are used in full color displays, sign panels, and so on. Blue LDs are used in the next generation optical disk equipment. These devices, blue LEDs and LDs, are in great demand today.

One method for manufacturing typical GaN-based blue LED is as follows.

FIG. 1 shows a cross sectional view of the typical GaN-based blue LED and FIG. 9 is a timing chart describing the treatment temperature for growing the layers. In these growing steps, the metal organic chemical vapor deposition (MOCVD) is applied.

As shown in FIG. 9, the sapphire substrate 1 is thermally cleaned in a hydrogen gas flow at 1100° C. (ST1), and the temperature is then brought down to 520° C. in the same gas flow (ST2). After changing the hydrogen gas in ST1 to a carrier gas having mixture of nitrogen and hydrogen in a ratio of 1:3, at ammonia gas ($NH_3$), and tri-methyl gallium (TMG), the GaN buffer layer 2 is formed at the thickness of 50 nm. The ammonia gas ($NH_3$) is a source of group V of elements and the tri-methyl gallium (TMG) is a source of group III of elements. The ammonia gas is present the entire time in the steps of growing compound layers of the group V of elements, even in the steps during the suspension of growing.

After increasing the temperature to 1100° C. an n-type GaN cladding layer 3 doped with Si and having a thickness of 4 $\mu$m, is grown in the same carrier gas with the TMG and $SiH_4$ (ST3). After growing the n-type GaN cladding layer 3, the temperature is decreased to 800° C. With the temperature at 800° C. stably, tri-methyl indium (TMI), TMG, $SiH_4$ and di-methyl zinc (DMZn) in the carrier gas ($N_2$ and $H_2$ at the ratio of 1:1) grow an InGaN emitting layer 4 doped with Si and Zn to a thickness of 0.2 $\mu$m on the n-type GaN cladding layer 3 (ST4). The TMI and the TMG produce the InGaN emitting layer 4 layer, and the $SiH_4$ and DMZn provide the dopants Si and Zn. In this specification the ratio of $N_2$ and $H_2$ as 1:1 is also expressed as "inert gas rich" or "nitrogen rich".

After growing the InGaN emitting layer 4, the ratio of $N_2$ and $H_2$ in the carrier gas is moved to 1:3 (a hydrogen rich condition) and the temperature is brought up to 1100° C. (ST55). At 1100° C. with the hydrogen rich carrier gas, a p-type AlGaN layer 5 doped with Mg and having a thickness of 0.2 $\mu$m is grown on the InGaN emitting layer 4 from a source gas having tri-methyl aluminum (TMA), TMG, and cyclopentadiphenyl magnesium ($Cp_2Mg$) added to the carrier gas. The $Cp_2Mg$ is the source of the dopant Mg. The p-type GaN layer 6 having a thickness of 0.3 $\mu$m, is grown in the gas containing TMG and $Cp_2Mg$ (ST6). After the p-type GaN layer 6 is deposited, temperature in the deposition chamber decreases to room temperature in the same carrier gas. Thus, the GaN-based light emitter device is obtained.

When the p-type AlGaN layer 5 is grown on the InGaN emitting layer 4 in the above conventional process, the temperature and the ratio of $H_2$ in the carrier gas must be increased after stopping the growth of the p-type InGaN emitting layer 4 (ST55) because the GaN grows at a temperature 200° C. higher than the InN does. Thus, in order to grow the p-type AlGaN layer 5, the InGaN emitting layer 4 is exposed in the high temperature through increasing the temperature step (ST55), namely from 800 to 1100° C. The InGaN emitting layer must hold fine in the high temperature atmosphere (about 800–1100° C.) to grow the AlGaN layer on later.

The hydrogen rich carrier gas is applied in ST55 because it is easier to refine the hydrogen gas than the nitrogen gas. However, the InGaN emitting layer 4 is degraded or destroyed when the temperature increases from 800 to 1100° C. under the hydrogen rich condition before growing the p-type GaN layer 6. It is difficult to maintain the quality of the InGaN emitting layer 4, so the light emitting efficiency and the reliance of the device deteriorate.

SUMMARY OF THE INVENTION

The present invention provides a novel method for manufacturing a GaN-based compound semiconductor emitting light device.

The object of the present invention is to solve the above problem and to hold the InGaN layer. The further object is to obtain a high quality crystal layer of InGaN under an AlGaN layer. Therefore the present invention offers a method to obtain a high quality GaN-based LED.

The inventors have found that it is impossible to hold the InGaN layer stable in a hydrogen rich carrier gas. Therefore, an LED manufactured by the above conventional method has often no InGaN emitting layer 4 or a very poor quality crystal InGaN layer. This problem yields poor light intensity and low reliability.

Because the diffusion coefficient of the ammonium gas is more than twice that of the nitrogen gas in the hydrogen gas, the density of $NH_3$ becomes thin in the hydrogen rich condition. The equilibrium pressure of the nitrogen for InN is double figures greater than that for GaN. Consequently the nitride in the InGaN emitting layer 4 decomposes easily, so that the quality of the crystal of the InGaN emitting layer 4 debases or the thickness of it fades away.

The hydrogen rich gas has been used because hydrogen gas is easier to refine than nitrogen gas.

The method according to this present invention for manufacturing a GaN-based emitting light device which has heterostructure is effective in the process to grow the $Al_yGa_{1-y}N$ ($0 \leq y \leq 1$) layer on the $In_xGa_{1-x}N$ ($0 \leq x \leq 1$) layer by CVD. The novel method has a step of holding or increasing the temperature in the inert gas rich condition after the step of growing the InGaN layer. Between growing the InGaN layer at the temperature of T0 and growing the AlGaN at the temperature of T1 (T0$\leq$T1), the present invention applies the inert rich carrier gas which includes a source of group V elements. Due to the step of using the inert rich carrier gas, rarefying the source gas of the group V elements near the surface of the InGaN layer is suppressed and the sublimation of the InGaN layer is prevented by increasing the steam pressure of the source gas of the group V elements near the surface of InGaN layer.

1 a sapphire substrate, 2 a buffer layer, 3 an n-type GaN layer, 4 an InGaN emitting layer, 5 a p-type AlGaN layer and 6 a p-type GaN layer.

Figure 2:
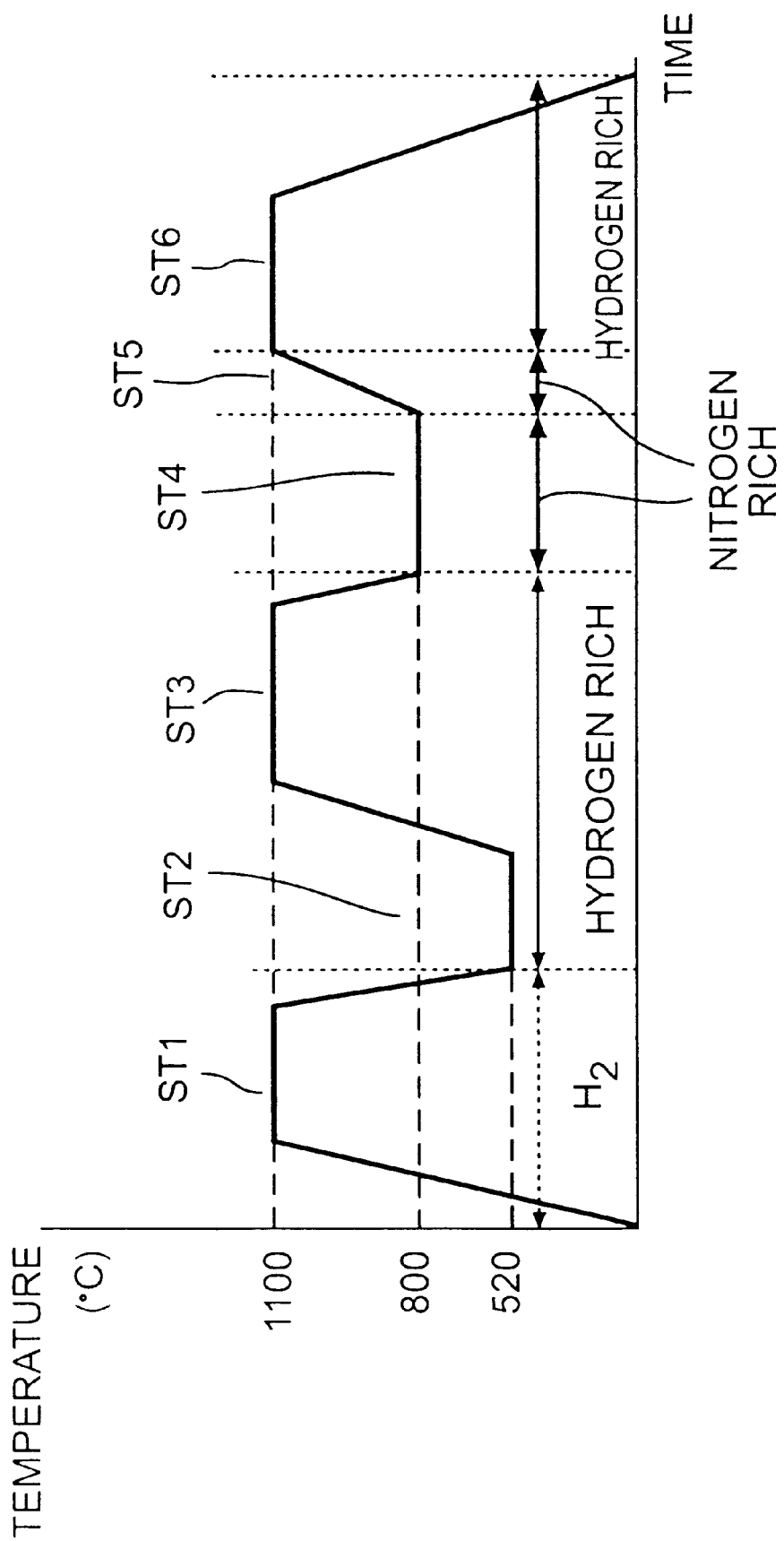

FIG. 2 illustrates a timing chart showing the relation between treating temperature and treating time of one embodiment of the present invention. ST1 is the thermal cleaning of the sapphire substrate 1 with the hydrogen gas only; ST2 growing the GaN buffer layer 2 using the hydrogen rich carrier gas, ST3 growing the n-type GaN layer 3 using the hydrogen rich carrier gas; ST4 growing the InGaN emitting layer 4 using the inert gas rich carrier gas; ST5 increasing the temperature with the inert gas rich condition using the inert gas rich carrier gas; and ST6 growing the p-type AlGaN layer 5 and the p-type GaN layer 6 using the hydrogen rich carrier gas.

Figure 3:
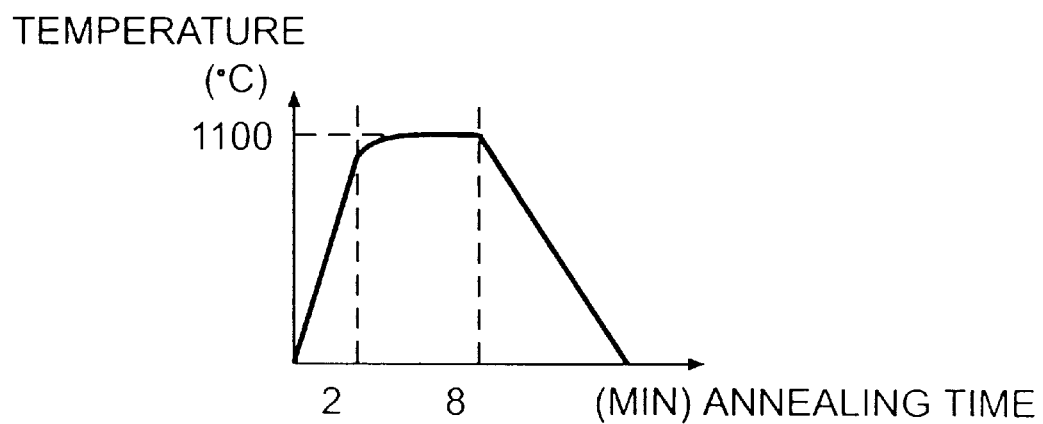

FIG. 3 shows the thermal anneal profile of a conventional process.

Figure 4:
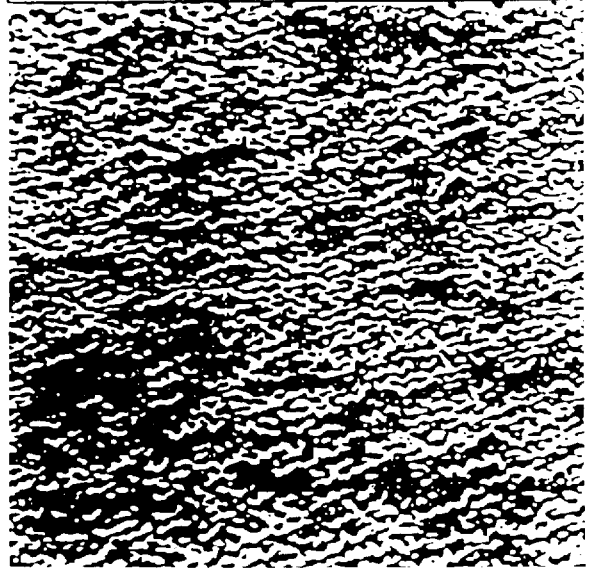

FIG. 4 is an SEM image which shows the surface crystal condition of the InGaN emitting layer 4 before the thermal anneal process.

Figure 5:
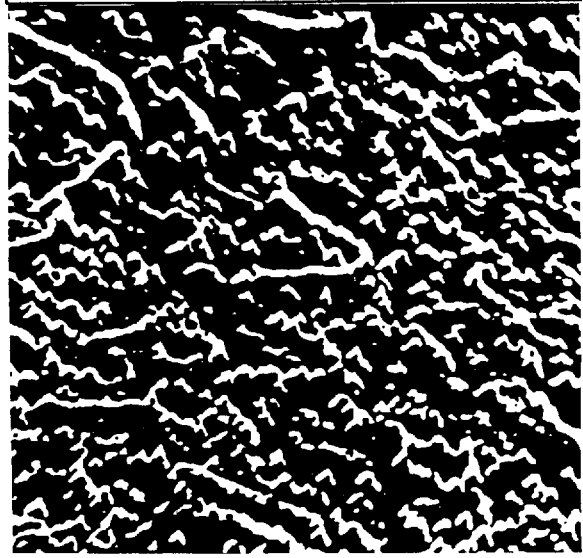

FIG. 5 is an SEM image which shows the surface crystal condition of the InGaN emitting layer 4 after the conventional thermal anneal process.

Figure 6:
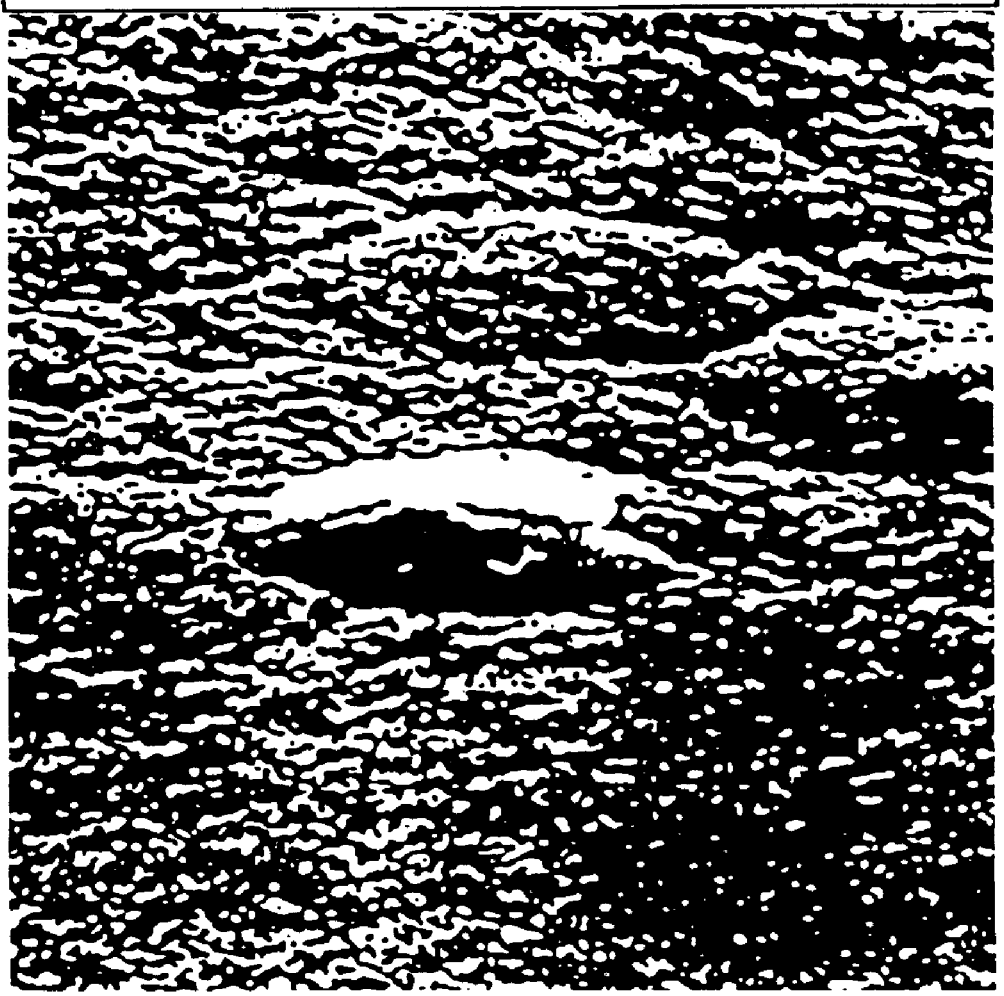

FIG. 6 is an SEM image which shows the surface crystal condition of the InGaN emitting layer 4 after the thermal anneal process in the example of the present invention. As shown in FIG. 5, the surface condition of the InGaN emitting layer 4 is spoiled by the conventional thermal anneal process. As shown in FIG. 6, the surface condition does not suffer any serious damage.

Figure 7:
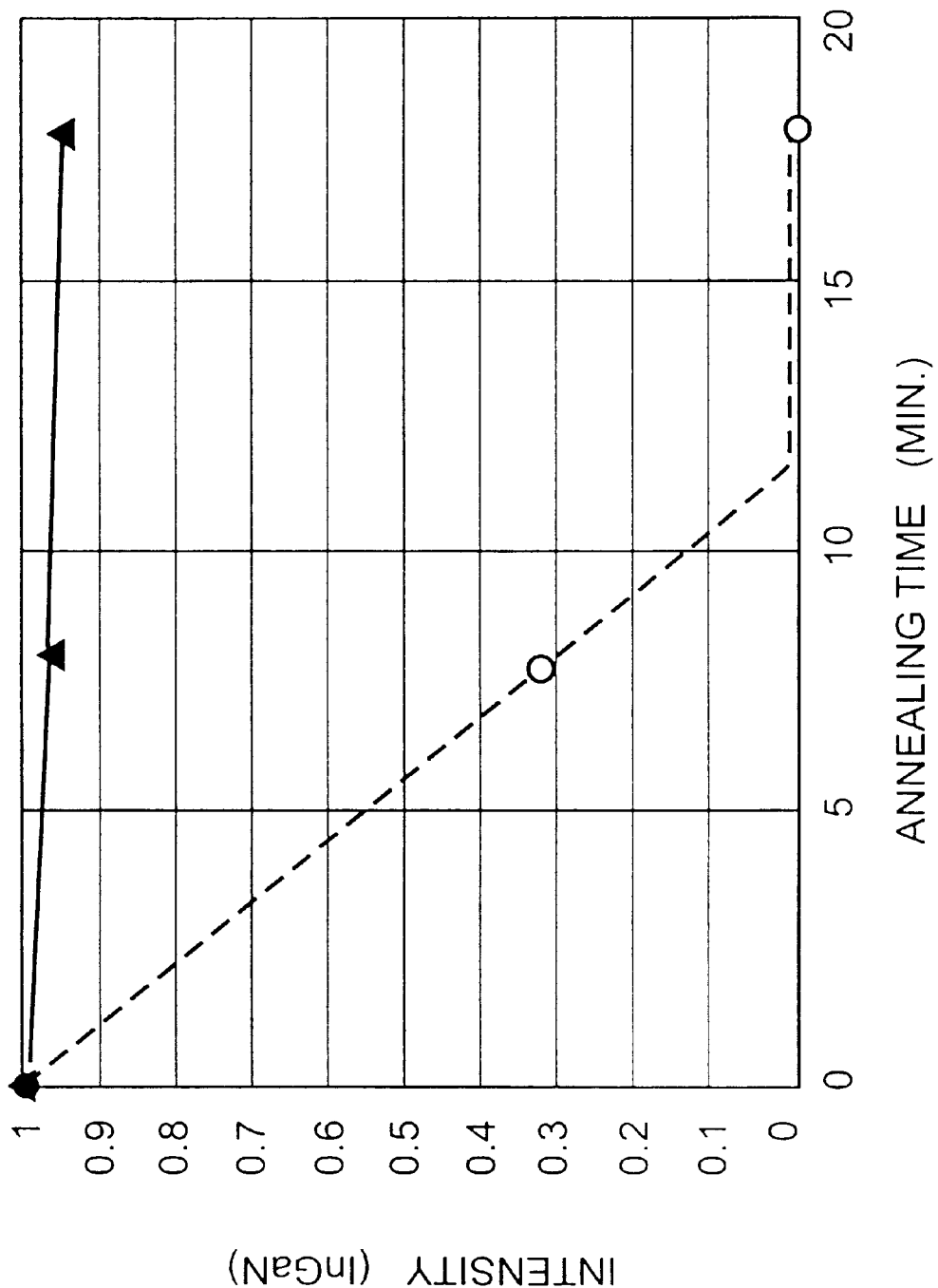

FIG. 7 illustrates the intensity of X-ray reflection depending on the thermal anneal time for the InGaN emitting layer 4. The intensity of X-ray reflection indicates the quality of the crystal in the InGaN emitting layer 4. FIG. 7 shows that the process of the present invention (the solid line) does not injure the surface of the InGaN emitting layer 4 after the thermal anneal step, and that the conventional process (the doted line) inflicts damage after the thermal anneal step.

Figure 8:
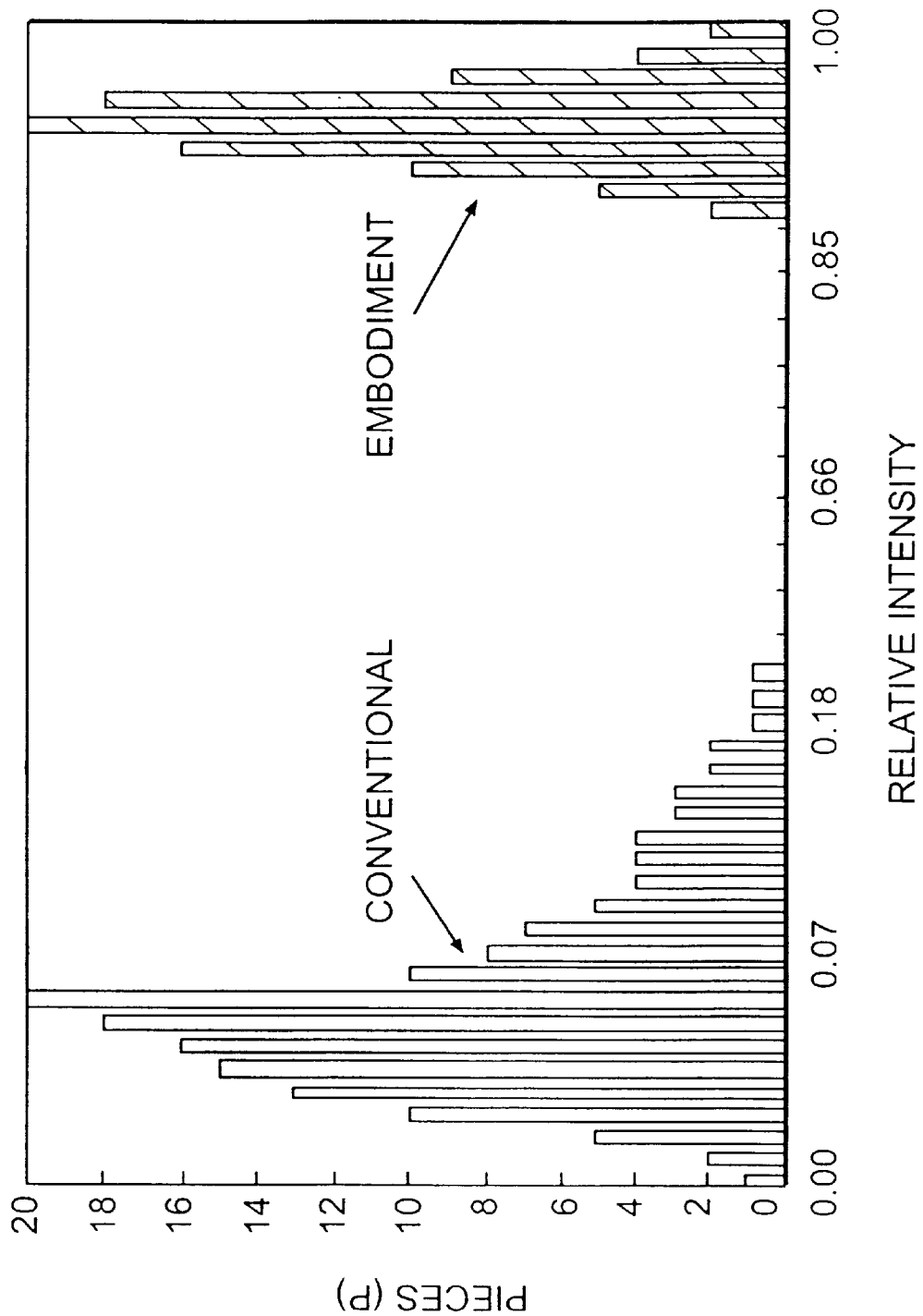

FIG. 8 illustrates the relative emitting light intensity of the example of the present invention and the example of the convention process. The examples of the present invention are able to emit about ten times more light than the conventional examples.

Figure 9:
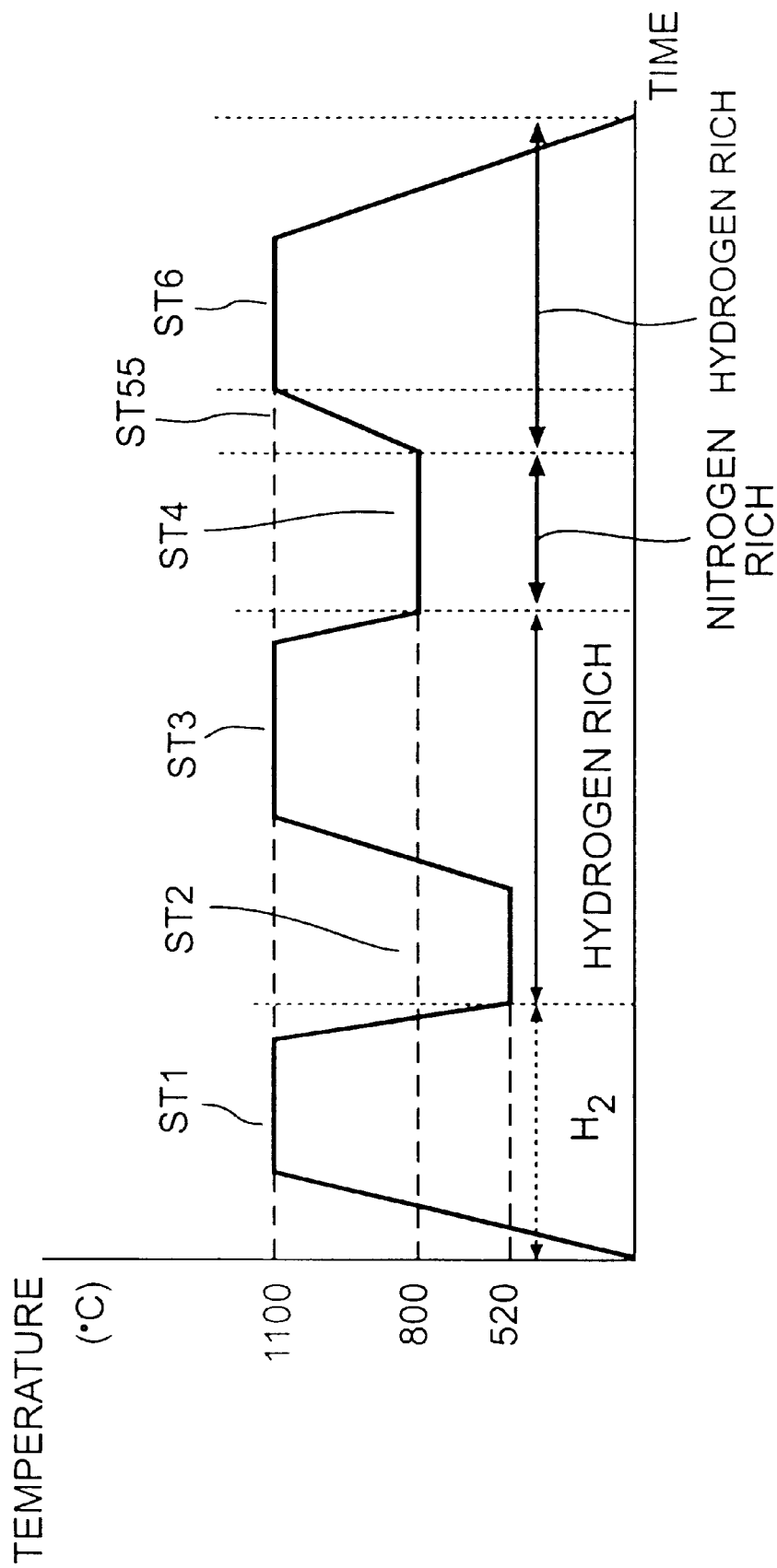

FIG. 9 illustrates a timing chart showing the relation between treatment temperature and treatment time in the conventional process. Step ST55 differs from the present invention as shown in FIG. 2. In ST55 the temperature is increased in a hydrogen rich carrier gas.

DETAILED DESCRIPTION OF THE PREFERRED EMBODIMENTS

The method of the present invention to manufacture a GaN-based LED for a signs, a full color display, and so on will be described in detail referring to FIGS. 1 and 2.

Figure 1:
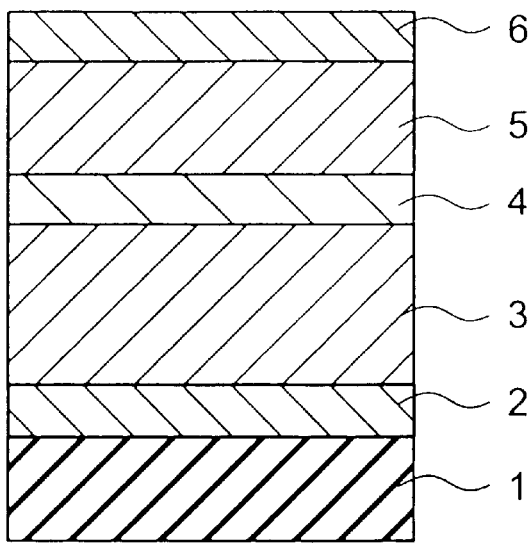
FIG. 1 shows the structure of a typical GaN-based light emitting element. The reference numerals show as follows.

FIG. 1 shows a rough cross sectional view of a GaN-based LED. FIG. 2 illustrates a timing chart of the treatment temperature and the treatment time. In this example the MOCVD method is applied.

As shown in FIG. 2, a sapphire substrate 1 is cleaned through the thermal cleaning step ST1 using $H_2$ gas at 1100° C.

After the cleaning step ST1, the temperature is decreased to 520° C. in the same gas, $H_2$. The carrier gas is also changed to a mixture gas comprising $N_2$ and $H_2$ at a 1:3 ratio, a hydrogen rich carrier gas. In the step ST2, $NH_3$ and TMG are supplied with the carrier gas for forming a GaN buffer layer 2 having a thickness of about 50 nm on the sapphire substrate 1. $NH_3$ is a source of group V elements, nitrogen. TMG is a source of group III elements, gallium, for growing a GaN-based compound semiconductor layer. $NH_3$ is supplied during all steps after this step ST2, even when growing a layer using group V elements is suspended.

An n-type GaN cladding layer 3 doped with Si and having a thickness of 4 $\mu$m is grown on the GaN buffer layer 2 through supplying TMG and $SiH_4$ and the same carrier gas as the step ST2 after the temperature is increased to 1100° C. (ST3). In this step ST3, the carrier gas is hydrogen rich. After growing the n-type GaN cladding layer 3, the temperature is reduced to 800° C. while keeping the same hydrogen rich carrier gas as in step ST2.

After the temperature becomes stable at 800° C., the carrier gas is changed to $N_2$ and $H_2$ mixture gas of 1:1 ratio. Namely, the carrier gas becomes nitrogen rich. An InGaN layer 4 doped with Zn and Si is grown on the n-type GaN cladding layer 3 while supplying TMI, TMG, $SiH_4$ and DMZn (ST4). TMI and TMG are the source of the grown InGaN layer 4; $SiH_4$ is the source of the dopant Si, and DMZn is the source of the dopant Zn.

After growing the InGaN layer 4, the mixture ratio of $N_2$ and $H_2$ in the carrier gas is changed to 3:1 from 1:1, a nitrogen rich condition also. The temperature is then increased to 1100° C. (ST5).

After the temperature becomes stable at 1100° C., the mixture of $N_2$ and $H_2$ carrier gas is returned to a 1:3 ratio, namely the carrier gas is now hydrogen rich. A p-type AlGaN layer 5 doped with Mg and having a thickness of 0.2 $\mu$m is grown on the InGaN layer 4 while supplying TMA, TMG and $Cp_2Mg$ which provides the dopant Mg. A p-type GaN layer 6 having a thickness of 0.3 $\mu$m is grown on the p-type AlGaN layer 5 while supplying TMG and $Cp_2Mg$ (ST6). After growing the p-type GaN layer 6, the temperature is decreased to room temperature in the same carrier gas of ST6. Consequently a GaN LED is manufactured as shown in FIG. 1.

Although the carrier gas consists of the nitrogen rich mixing $N_2$ and $H_2$ in the above embodiment, it is also possible to replace $N_2$ with an inert gas such as Ne, Ar, Kr, Xe and $SF_6$ etc.

The surface condition of the InGaN layer 4 made according the present invention and the conventional process under the influence of the thermal anneal step is discussed with reference to FIGS. 4, 5 and 6.

The InGaN layer 4 endures the thermal anneal process under the same temperature profile as shown in FIG. 3. The anneal process has a 2 minute temperature increasing stage, a 6 minute stage maintaining the temperature at 1100° C., and a decreasing temperature stage. Two samples with an InGaN layer 4 on an n-type GaN layer 3 on a sapphire substrate 1 are compared. One sample had the anneal process in a nitrogen rich carrier gas, that is the method of the present invention, and the other sample in a hydrogen rich carrier gas, that is the conventional method. FIG. 4 is the SEM image of the surface of the InGaN layer 4 before the anneal process. FIG. 5 shows the SEM image of the surface after the anneal process using the hydrogen rich carrier gas, which is used in the conventional method. FIG. 6 shows of the surface after the process using the nitrogen rich carrier gas, that is the method of the present invention. The surface of the InGaN layer after the anneal with the hydrogen rich carrier gas is heavily damaged as shown in FIG. 5. On the other hand, the surface of the InGaN layer after the anneal with the nitrogen rich carrier gas is not damaged.

FIG. 7 shows the diagram of the intensity of the X-ray analysis depending on the annealing time. The solid line represents the example of present invention, and the dotted line represents the conventional example. The decreasing of the intensity of the X-ray shows the damage of the crystal surface. The intensity of the X-ray decrease 70% depending on the annealing time after the conventional process. However the intensity is held substantially at the same level after the process of the present invention.

FIG. 8 shows the relative emitting intensity of the LEDs made according to the present invention and the LEDs made according to the conventional method. The intensity of the LEDs is normalized based on the strongest intensity of the sample LEDs. The emitting light intensity of the LEDs made according to the present invention is ten times stronger than that of the LEDs made according to the conventional method.

The nitride rich carrier gas holds the high density of $NH_3$ near the surface of the InGaN layer. Therefore the gas suppresses the breakdown of the InGaN crystal while increasing the temperature significantly. The present invention provides a method for manufacturing a highly reliable GaN-based compound semiconductor LEDs with a high crystal quality of InGaN.

What is claimed is:

1. A method for manufacturing a GaN-based compound semiconductor device, comprising the steps of:

forming an $In_xGa_{1-y}N$ ($0 \leq x \leq 1$) layer on a substrate at a temperature T0 with a first carrier gas comprising an inert gas;

forming an $Al_yGa_{1-y}N$ ($0 \leq y \leq 1$) layer on the $In_xGa_{1-x}N$ layer at the temperature T1 (T0$\leq$T1) with a second carrier gas different from the first carrier gas, and keeping the first carrier gas while adjusting the temperature from T0 to T1.

2. The method according to claim 1, wherein T0$\leq$T1.

3. The method according to claim 1, wherein the inert gas is selected from the group consisting of $N_2$, Ne, Ar, Kr, Xe and $SF_6$.

4. The method according to claim 1, wherein the first and second carrier gases contain $H_2$.

5. The method according to claim 1, wherein the first and second carrier gas includes a gas of the group V elements.

6. The method according to claim 5, wherein a diffusion coefficient of the gas of the group V elements against the first carrier gas is less than a diffusion coefficient against $H_2$.

7. The method according to claim 5, wherein the gas of the group V of elements is chosen from the group consisting of $NH_3$, $N_2H_4$, $N_2H_3CH_3$ and $N_2H_2(CH_3)_2$.

8. The method according to claim 1, wherein the temperatures T0 and T1 are within the ranges:

400° C.$\leq$T0$\leq$950° C. and

600° C.$\leq$T1$\leq$1300° C.

9. A method for manufacturing a GaN-based compound semiconductor light emitting device, comprising the steps of:

forming a GaN layer on a transparent substrate;

forming an $In_xGa_{1-x}N$ ($0 \leq x \leq 1$) layer on the GaN layer at the temperature T0 with a first carrier gas comprising an inert gas;

forming an $Al_yGa_{1-y}N$ ($0 \leq y \leq 1$) layer on the $In_xGa_{1-x}N$ layer at the temperature T1 (T0$\leq$T1) with a second carrier gas different from the first gas; and keeping the first carrier gas while adjusting the temperature from T0 to T1 to prevent the $In_xGa_{1-x}N$ from subliming.

10. The method according to claim 9, wherein T0$\leq$T1.

11. The method according to claim 9, wherein the inert gas is selected from the group consisting of $N_2$, Ne, Ar, Kr, Xe and $SF_6$.

12. The method according to claim 9, wherein the first and second carrier gases contain $H_2$.

13. The method according to claim 9, wherein the first and second carrier gas includes a gas of the group V elements.

14. The method according to claim 13, wherein a diffusion coefficient of the gas of the group V elements against the first carrier gas is less than a diffusion coefficient against $H_2$.

15. The method according to claim 13, wherein the gas of the group V of elements is chosen from the group consisting of $NH_3$, $N_2H_4$, $N_2H_3CH_3$ and $N_2H_2(CH_3)_2$.

16. The method according to claim 9, wherein the temperatures T0 and T1 are within the ranges:

400° C.$\leq$T0$\leq$950° C. and

600° C.$\leq$T1$\leq$1300° C.

17. A method for manufacturing a GaN-based compound semiconductor device, comprising the steps of:

forming an $In_xGa_{1-x}N$ ($0 \leq x \leq 1$) layer on a substrate at a temperature T0; and increasing the temperature from T0 to T1 (T0$\leq$T1) in a carrier gas which is inert gas rich after forming the $In_xGa_{1-x}N$ layer, to prevent the nitrogen from the $In_xGa_{1-x}N$ layer from sublimating.

18. The method according to claim 17, wherein the carrier gas contains inert gas selected from the group consisting of $N_2$, Ne, Ar, Kr, Xe and $SF_6$.

19. The method according to claim 17, wherein the gas contain $H_2$.

20. The method according to claim 17, wherein the carrier gas includes a gas of the group V elements.

21. The method according to claim 20, wherein a diffusion coefficient of the gas of the group V elements of the carrier gas is less than a diffusion coefficient of $H_2$.

22. The method according to claim 20, wherein the gas of the group V of elements is chosen from the group consisting of $NH_3$, $N_2H_4$, $N_2H_3CH_3$ and $N_2H_2(CH_3)_2$.

23. The method according to claim 17, wherein the temperatures T0 and T1 are within the ranges:

400° C.$\leq$T0$\leq$950° C. and

600° C.$\leq$T1$\leq$1300° C.

24. A method according to claim 17, further comprising the additional step of:

forming an $Al_yGa_{1-y}N$ ($0 \leq y \leq 1$) layer on the $In_xGa_{1-x}N$ layer at the temperature T1.

25. The method according to claim 17, wherein the carrier gas contains more than 50% inert gas.

* * * * *